(12) United States Patent
Wang et al.

(10) Patent No.: US 10,756,709 B1
(45) Date of Patent: Aug. 25, 2020

(54) CONTROLLING EDGE RATE OF A SWITCHED OUTPUT STAGE BASED ON A MEASURED PHYSICAL QUANTITY

(71) Applicant: Cirrus Logic International Semiconductor Ltd., Edinburgh (GB)

(72) Inventors: Mengde Wang, Austin, TX (US);
Akhilesh Persha, Austin, TX (US);
Eric B. Smith, Austin, TX (US);
Vamsikrishna Parupalli, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/439,178

(22) Filed: Jun. 12, 2019

(51) Int. Cl.
| H03K 17/06 | (2006.01) |
| H02M 1/08 | (2006.01) |
| H02M 3/156 | (2006.01) |
| H02M 3/158 | (2006.01) |
| H03K 3/011 | (2006.01) |
| G01R 19/00 | (2006.01) |
| G01K 1/14 | (2006.01) |
| H03K 3/017 | (2006.01) |

(52) U.S. Cl.
CPC ............. *H03K 3/011* (2013.01); *G01K 1/14* (2013.01); *G01R 19/0084* (2013.01); *H03K 3/017* (2013.01)

(58) Field of Classification Search
CPC ...... H03K 3/011; H03K 3/017; H03K 17/165; H03K 5/156; H03K 7/08; G01R 19/0084; G01K 1/14
See application file for complete search history.

(56) References Cited

U.S. PATENT DOCUMENTS

| 6,366,867 | B2 * | 4/2002 | Sine ................. G01R 31/31715 326/27 |
| 7,053,679 | B2 * | 5/2006 | Rho ..................... G11C 7/1051 326/83 |
| 7,498,844 | B2 * | 3/2009 | Rho .................... H03K 19/0013 326/33 |
| 7,786,753 | B2 * | 8/2010 | Jeong ............. H03K 19/018585 326/29 |
| 7,839,200 | B2 * | 11/2010 | Im ............................. G11C 7/04 327/170 |
| 9,337,807 | B2 * | 5/2016 | Hollis .................... H03K 3/011 |
| 9,425,785 | B1 * | 8/2016 | Wibben ............... H03K 17/165 |
| 2003/0042953 | A1 * | 3/2003 | Shin ........................ H03K 5/133 327/170 |
| 2009/0168549 | A1 * | 7/2009 | Jeon ......................... G11C 7/02 365/189.05 |

* cited by examiner

Primary Examiner — Kenneth B Wells
(74) Attorney, Agent, or Firm — Jackson Walker L.L.P.

(57) ABSTRACT

A system may include a driver for driving an output signal to a load, a pre-driver for driving a pre-driver signal to the driver, the pre-driver having a variable drive strength, and a controller configured to control the variable drive strength based on at least one measured physical quantity to compensate for variation of an output signal edge rate due to variations in the at least one measured physical quantity.

12 Claims, 3 Drawing Sheets

CONTROLLING EDGE RATE OF A SWITCHED OUTPUT STAGE BASED ON A MEASURED PHYSICAL QUANTITY

FIELD OF DISCLOSURE

The present disclosure relates in general to a mobile device, and more particularly, to controlling parameters of a switched output stage based on a measured physical quantity.

BACKGROUND

Many electronic devices on the market today often use power converters to convert electric energy from one form to another (e.g., converting between alternating current and direct current), amplifying a voltage or current of an electrical signal, modifying a frequency of an electrical signal, or some combination of the above. Examples of power converters may include boost converters, buck converters, and audio amplifiers (including, but not limited to Class D and Class H amplifiers). Such power converters often employ a switched output stage to drive an electronic signal (e.g., an output current or voltage) to a mechanical transducer (e.g., a loudspeaker, a voice coil, a vibrational transducer, etc.).

During operation of a vibrational transducer, properties of an amplifier system (capacitance, resistance, inductance, threshold voltages, etc.) may change as a function of temperature, supply voltage, and/or other environmental factors, thus affecting a slew rate of the output signal driven by an output stage. Accordingly, systems and methods are desired to maintain a desired output signal edge rate in the presence of varying physical quantities associated with the amplifier system driving the output signal.

SUMMARY

In accordance with the teachings of the present disclosure, the disadvantages and problems associated with minimizing variation in an audio system response to changes in temperature, supply voltage, and/or other physical quantities may be reduced or eliminated.

In accordance with embodiments of the present disclosure, a system may include a driver for driving an output signal to a load, a pre-driver for driving a pre-driver signal to the driver, the pre-driver having a variable drive strength, and a controller configured to control the variable drive strength based on at least one measured physical quantity to compensate for variation of an output signal edge rate due to variations in the at least one measured physical quantity.

In accordance with these and other embodiments of the disclosure, a method may include driving an output signal to a load with a driver, driving a pre-driver signal to the driver with a pre-driver, the pre-driver having a variable drive strength, and controlling the variable drive strength based on at least one measured physical quantity to compensate for variation of an output signal edge rate due to variations in the at least one measured physical quantity.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
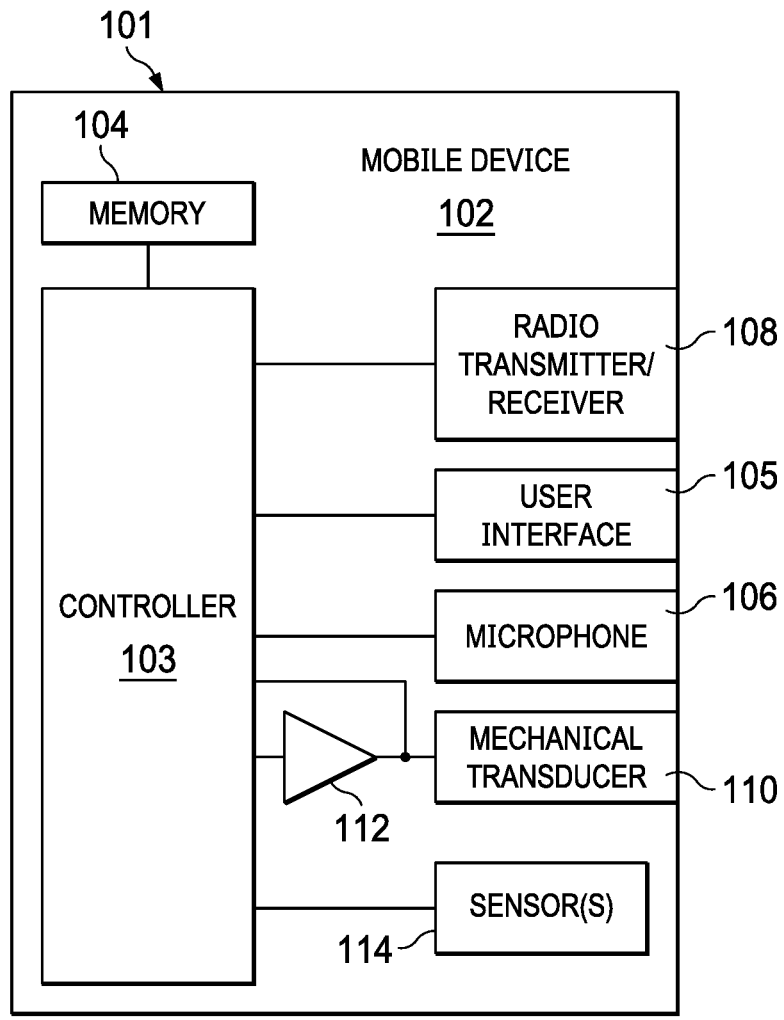
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a user interface 105, a microphone 106, a radio transmitter/receiver 108, a mechanical transducer 110, an amplifier 112, and one or more sensors 114.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, or any other device that may be readily transported on a person of a user of mobile device 102.

Controller 103 is housed within enclosure 101 and may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

User interface 105 may be housed at least partially within enclosure 101, may be communicatively coupled to controller 103, and may comprise any instrumentality or aggregation of instrumentalities by which a user may interact with mobile device 102. For example, user interface 105 may permit a user to input data and/or instructions into mobile device 102 (e.g., via a keypad and/or touch screen), and/or otherwise manipulate mobile device 102 and its associated components. User interface 105 may also permit mobile device 102 to communicate data to a user, e.g., by way of a display device.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies as based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

Mechanical transducer 110 may be housed at least partially within enclosure 101 or may be external to enclosure 101, may be communicatively coupled to controller 103 (e.g., via a respective amplifier 112), and may comprise any system, device, or apparatus made with one or more materials configured to generate electric potential or voltage when mechanical strain is applied to mechanical transducer 110, or conversely to undergo mechanical displacement or change in size or shape (e.g., change dimensions along a particular plane) when a voltage is applied to mechanical transducer 110. In some embodiments, a mechanical transducer may comprise a piezoelectric transducer made with one or more materials configured to, in accordance with the piezoelectric effect, generate electric potential or voltage when mechanical strain is applied to mechanical transducer 110, or conversely to undergo mechanical displacement or change in size or shape (e.g., change dimensions along a particular plane) when a voltage is applied to mechanical transducer 110.

In some embodiments, mechanical transducer 110 may comprise a voice coil structure similar to a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field may be created by the electric current in the voice coil, making the voice coil a variable electromagnet. The coil and the driver's magnetic system may interact, generating a mechanical force that may cause the coil (and thus, the attached cone) to move back and forth, thereby reproducing sound under the control of an applied electrical signal coming from an amplifier (e.g., amplifier 112). In other embodiments, mechanical transducer 110 may comprise a voice coil structure similar to a dynamic loudspeaker, but without a diaphragm, such that that voice coil drives mechanical vibration of a surface of mobile device 110.

Although a piezoelectrical transducer and an acoustic transducer are given as examples of mechanical transducer 110, mechanical transducer 110 may include any other suitable transducer.

Amplifier 112 may comprise any system, device, or apparatus configured to amplify or attenuate an input signal to generate an output signal which is an amplified or attenuated version of the input signal, and drive such output signal to a load, such as mechanical transducer 110.

A sensor 114 may comprise any suitable system, device, or apparatus configured to sense a physical quantity within mobile device 102 and generate a signal indicative of such physical quantity. For example, in some embodiments, a sensor 114 may comprise a temperature sensor 114 (e.g., a thermometer, thermistor, etc.) configured to sense a temperature within mobile device 102 (e.g., proximate to amplifier 112) and communicate a signal to controller 103 indicative of such temperature. As another example, a sensor 114 may comprise a voltage sensor configured to sense a voltage associated with mechanical transducer 110 (e.g., a supply voltage of amplifier 112).

Although specific example components are depicted above in FIG. 1 as being integral to mobile device 102 (e.g., controller 103, memory 104, user interface 105, microphone 106, radio transmitter/receiver 108, mechanical transducer 110, amplifier 112, and sensor(s) 114), a mobile device 102 in accordance with this disclosure may comprise one or more components not specifically enumerated above.

Figure 2:
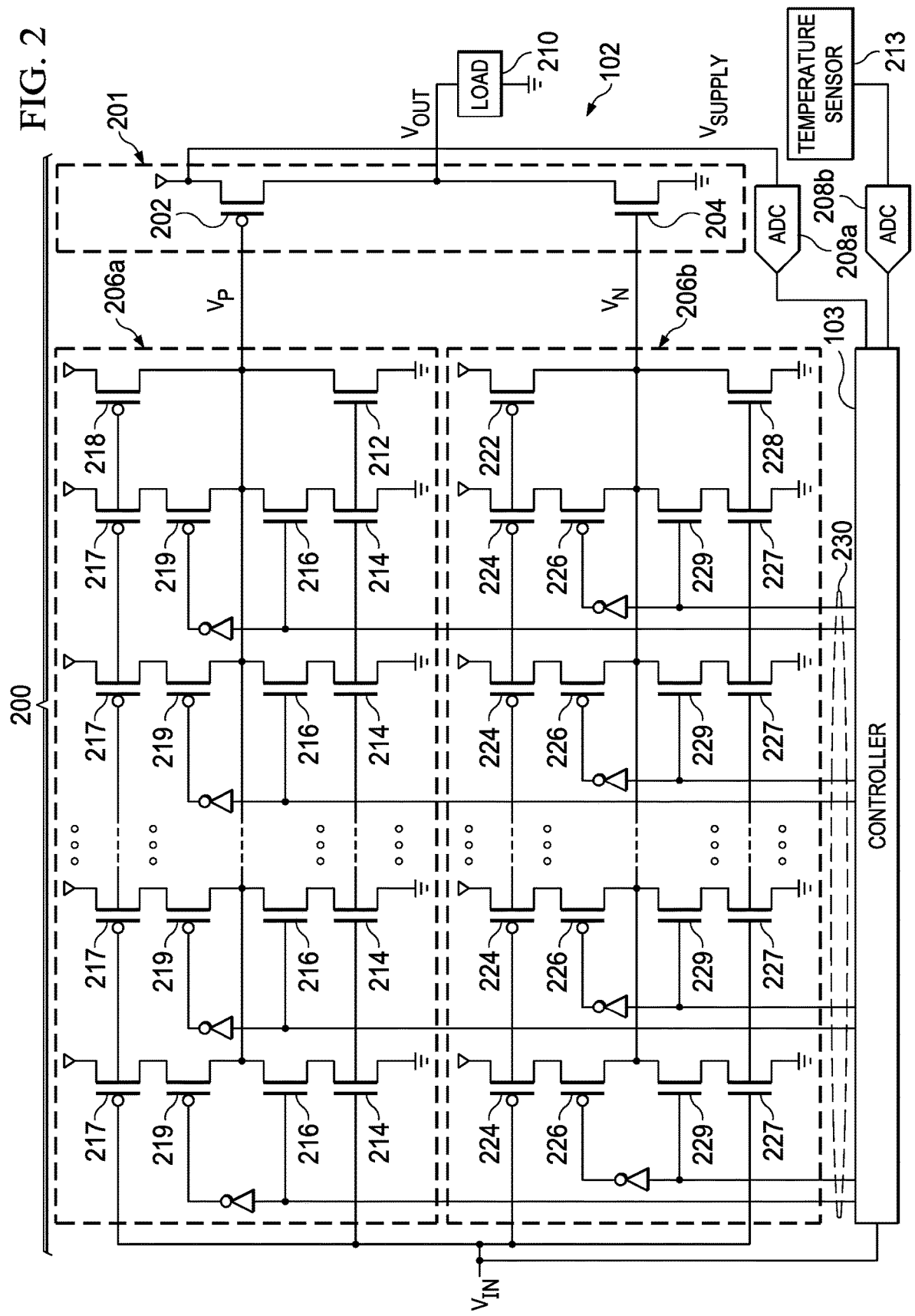
FIG. 2 illustrates selected components of an example mobile device for controlling an edge rate of an output signal generated by an amplifier system, in accordance with embodiments of the present disclosure.

FIG. 2 illustrates selected components of an example mobile device 102 for controlling an edge rate of an output signal $V_{OUT}$ generated by an amplifier system 200 comprising switched output stage 201 for driving a load 210 and further comprising a predriver subsystem comprising predriver circuits 206a and 206b, in accordance with embodiments of the present disclosure. Additional components may include analog-to-digital converters (ADCs) 208 (e.g., ADC 208a and ADC 208b), and a temperature sensor 213.

Switched output stage 201 may comprise a driver including a pull-up driver device 202 (implemented as a p-type metal-oxide-semiconductor field effect transistor in the embodiments represented by FIG. 2) coupled at its non-gate terminals between a supply voltage and an output node and a pull-down driver device 204 (implemented as an n-type metal-oxide-semiconductor field effect transistor in the embodiments represented by FIG. 2) coupled at its non-gate terminals between a ground voltage and the output node. Based on respective input voltage signals driven to their respective gates, pull-up driver device 202 and pull-down driver device 204 may drive an output voltage $V_{OUT}$ to load 210 which is a function of its respective input voltage signals $V_P$ and $V_N$. In some embodiments, respective input voltage signals $V_P$ and $V_N$ may be pulse-width-modulated voltage signals such that output voltage $V_{OUT}$ is in turn a pulse-width-modulated voltage signal. In some embodiments, switched output stage 201 may comprise at least a portion of an output stage of a power converter. In certain of such embodiments, such power converter may comprise a Class-D amplifier.

Predriver circuit 206a may receive an input signal $V_{IN}$ (e.g., a pulse-width-modulated voltage signal) and generate an input voltage signal $V_P$ to the gate terminal of pull-up driver device 202 which is a function of $V_{IN}$. As shown in FIG. 2, predriver circuit 206a may comprise a pull-up device 218 (implemented as a p-type metal-oxide-semiconductor field effect transistor in the embodiments represented by FIG. 2), a pull-down device 212 (implemented as an n-type metal-oxide-semiconductor field effect transistor in the embodiments represented by FIG. 2), one or more pairs of series-connected pull-down devices 214, 216 and one or more pairs of series connected pull-up devices 217, 219. Each pair of series-connected pull-down devices may be in parallel with pull-down device 212 and each such pair of series-connected pull-down devices may comprise an input-controlled pull-down device 214 (implemented as an n-type metal-oxide-semiconductor field effect transistor in the embodiments represented by FIG. 2) and a controller-controlled pull-down device 216 (implemented as an n-type metal-oxide-semiconductor field effect transistor in the embodiments represented by FIG. 2). Each input-controlled pull-down device 214 may be coupled to its associated controller-controlled pull-down device 216 such that when each of input-controlled pull-down device 214 and controller-controlled pull-down device 216 is turned on (e.g., has a gate terminal voltage exceeding its threshold voltage), such associated pull-down devices 214 and 216 provide a conductive path between the gate terminal of pull-up driver device 202 and a ground voltage.

Similarly, each pair of series-connected pull-up devices may be in parallel with pull-up device 218 and each such pair of series-connected pull-up devices may comprise an input-controlled pull-up device 217 (implemented as a p-type metal-oxide-semiconductor field effect transistor in the embodiments represented by FIG. 2) and a controller-controlled pull-up device 219 (implemented as a p-type metal-oxide-semiconductor field effect transistor in the embodiments represented by FIG. 2). Each input-controlled pull-up device 217 may be coupled to its associated controller-controlled pull-up device 219 such that when each of input-controlled pull-up device 217 and controller-controlled pull-up device 219 is turned on (e.g., has a gate terminal voltage below its threshold voltage), such associated pull-up devices 217 and 219 provide a conductive path between the gate terminal of pull-up driver device 202 and a supply voltage.

An input-controlled pull-down device 214 may be driven at its gate terminal by input signal $V_{IN}$ (or a derivative thereof) which may selectively turn on and turn off such input-controlled pull-down device 214. Similarly, an input-controlled pull-up device 217 may be driven at its gate terminal by input signal $V_{IN}$ (or a derivative thereof) which may selectively turn on and turn off such input-controlled pull-up device 217. Each controller-controlled pull-down device 216 and each controller-controlled pull-up device 219 may be driven at its gate terminal by a control signal 230 generated by controller 103 (or a derivative thereof, such as a logically inverted version thereof, for example), such that controller 103 may selectively enable and disable the various controller-controlled pull-down devices 216 and controller-controlled pull-up devices 219, as described in greater detail below. Thus, pull-down devices 212, 214, and 216 create a pull circuit to drive the input voltage signal at the gate terminal of pull-up driver device 202 to a ground voltage, wherein the drive strength of the pull circuit is dependent upon which of controller-controlled pull-down devices 216 are enabled. In addition, pull-up devices 218, 217, and 219 create a pull circuit to drive the input voltage signal at the gate terminal of pull-up driver device 202 to a supply voltage, wherein the drive strength of the pull circuit is dependent upon which of controller-controlled pull-up devices 219 are enabled. Accordingly, the gate terminal of pull-up driver device 202 may have an effective impedance, wherein the effective impedance decreases as the drive strength increases, and vice versa.

Predriver circuit 206b may receive an input signal $V_{IN}$ (e.g., a pulse-width-modulated voltage signal) and generate an input voltage signal to the gate terminal of pull-down driver device 204 which is a function of $V_{IN}$. As shown in FIG. 2, predriver circuit 206b may comprise a pull-down device 228 (implemented as an n-type metal-oxide-semiconductor field effect transistor in the embodiments represented by FIG. 2), a pull-up device 222 (implemented as a p-type metal-oxide-semiconductor field effect transistor in the embodiments represented by FIG. 2), one or more pairs of series-connected pull-up devices 224, 226 and one or more pairs of series connected pull-down devices 227, 229. Each pair of series-connected pull-up devices may be in parallel with pull-up device 222 and each such pair of series-connected pull-up devices may comprise an input-controlled pull-up device 224 (implemented as a p-type metal-oxide-semiconductor field effect transistor in the embodiments represented by FIG. 2) and a controller-controlled pull-up device 226 (implemented as a p-type metal-oxide-semiconductor field effect transistor in the embodiments represented by FIG. 2). Each input-controlled pull-up device 224 may be coupled to its associated controller-controlled pull-up device 226 such that when each of input-controlled pull-up device 224 and controller-controlled pull-up device 226 is turned on (e.g., has a gate terminal voltage less than its threshold voltage), such associated pull-up devices 224 and 226 provide a conductive path between the gate terminal of pull-down driver device 204 and a supply voltage.

Similarly, each pair of series-connected pull-down devices may be in parallel with pull-down device 228 and each such pair of series-connected pull-down devices may comprise an input-controlled pull-down device 227 (implemented as an n-type metal-oxide-semiconductor field effect transistor in the embodiments represented by FIG. 2) and a controller-controlled pull-down device 229 (implemented as an n-type metal-oxide-semiconductor field effect transistor in the embodiments represented by FIG. 2). Each input-controlled pull-down device 227 may be coupled to its associated controller-controlled pull-down device 229 such that when each of input-controlled pull-down device 227 and controller-controlled pull-down device 229 is turned on (e.g., has a gate terminal voltage below its threshold voltage), such associated pull-down devices 227 and 229 provide a conductive path between the gate terminal of pull-down driver device 204 and a ground voltage.

An input-controlled pull-up device 224 may be driven at its gate terminal by input signal $V_{IN}$ (or a derivative thereof) which may selectively turn on and turn off such input-controlled pull-down device 224. Similarly, an input-controlled pull-down device 227 may be driven at its gate terminal by input signal $V_{IN}$ (or a derivative thereof) which may selectively turn on and turn off such input-controlled pull-down device 227. Each controller-controlled pull-up device 226 and each controller-controlled pull-down device 229 may be driven at its gate terminal by a control signal 230 generated by controller 103 (or a derivative thereof, such as a logically inverted version thereof, for example), such that controller 103 may selectively enable and disable the various controller-controlled pull-up devices 226 and controller-controlled pull-down devices 229. Thus, pull-up devices 222, 224, and 226 create a pull circuit to drive the input voltage signal at the gate terminal of pull-down driver device 204 to a supply voltage, wherein the drive strength of the pull circuit is dependent upon which of controller-controlled pull-up devices 226 are enabled. In addition, pull-down devices 228, 227, and 229 create a pull circuit to drive the input voltage signal at the gate terminal of pull-down driver device 204 to a ground voltage, wherein the drive strength of the pull circuit is dependent upon which of controller-controlled pull-down devices 229 are enabled. Accordingly, the gate terminal of pull-down driver device 204 may have an effective impedance, wherein the effective impedance decreases as the drive strength increases, and vice versa.

Temperature sensor 213 may comprise any system, device, or apparatus (e.g., a thermometer, thermistor, etc.) configured to sense a temperature associated with output stage 201 and communicate a signal to ADC 208b indicative of such temperature.

An ADC 208 may comprise any system, device, or apparatus configured to receive an analog signal and convert such analog signal to an equivalent digital signal. For example, ADC 208a may receive an analog signal $V_{SUPPLY}$ indicative of a supply voltage used to power output stage 201 and convert such analog signal to an equivalent digital signal. Thus, ADC 208a may implement a digital voltage sensor. As another example, ADC 208b may receive an analog indicative of a measured temperature and convert such analog signal to an equivalent digital signal. Thus, together, temperature sensor 213 and ADC 208b may implement a digital temperature sensor. In some embodiments, sensor(s) 114 of FIG. 1 may comprise one or more of temperature sensor 213, ADC 208a, and ADC 208b. In some embodiments, one or more of ADC 208a, ADC 208b, and temperature sensor 213 may be formed on an integrated circuit upon which output stage 201 is formed.

Load 210 may comprise any suitable load that may be driven by switched output stage 201, including, without limitation, a mechanical transducer 110.

In operation, controller 103 may be configured to, based on one or more measured physical quantities associated with output stage 201 (e.g., supply voltage $V_{SUPPLY}$ and/or temperature sensed by temperature sensor 213), selectively enable controller-controlled pull-down devices 216 and 229 and controller-controlled pull-up devices 219 and 226 via control signals 230 (or a derivative thereof, such as a logically inverted version thereof, for example), thus controlling the drive strength of predriver circuits 206a and 206b (and accordingly, the effective impedances of the gate terminals of pull-up driver device 202 and pull-down driver device 204) based on the one or more measured physical quantities. Thus, because an output signal edge rate of output signal $V_{OUT}$ may vary due to variations in supply voltage $V_{SUPPLY}$, temperature associated with output stage 210, and/or other environmental conditions, the control by controller 103 of the variable drive strength based on one or more physical quantities may compensate for the variation of the output signal edge rate due to variations in the one or more physical quantities, and thus maintain the output signal edge rate at an approximate desired edge rate.

As an example, responsive to a change in a measured physical quantity that would otherwise reduce the output signal edge rate generated by output stage 201, controller 103 may increase the drive strength of predriver circuits 206a and 206b to maintain the output signal edge rate at an approximate desired edge rate. Conversely, responsive to a change in a measured physical quantity that would otherwise increase the output signal edge rate generated by output stage 201, controller 103 may increase the drive strength of predriver circuits 206a and 206b to maintain the output signal edge rate at an approximate desired edge rate.

In some embodiments, controller 103 may be configured to determine a relation of the output signal edge rate to the at least one measured physical quantity. For example, in some embodiments, controller 103 may apply a mathematical formula or algorithm that correlates the output signal edge rate to the at least one measured physical quantity. In other embodiments, controller 103 may implement a lookup table that indexes a measured physical quantity to a particular uncompensated output signal edge rate associated with the measured physical quantity. Based on such relation, controller 103 may generate and communicate one or more control signals to predriver circuits 206a and 206b based on the relation in order to control the variable drive strength.

Although FIG. 2 depicts controlling predriver circuits of a Class-D amplifier output stage to control output signal edge rate, similar and identical approaches may be applied to other power converter systems, including boost converters, buck converters, buck-boost converters, and/or other switched-mode power converters. For example, FIG. 3 illustrates an example system 300 comprising a boost converter 302 for converting an input source voltage $V_{BAT}$ to produce an output voltage $V_{OUT}$, in accordance with embodiments of the present disclosure.

Figure 3:
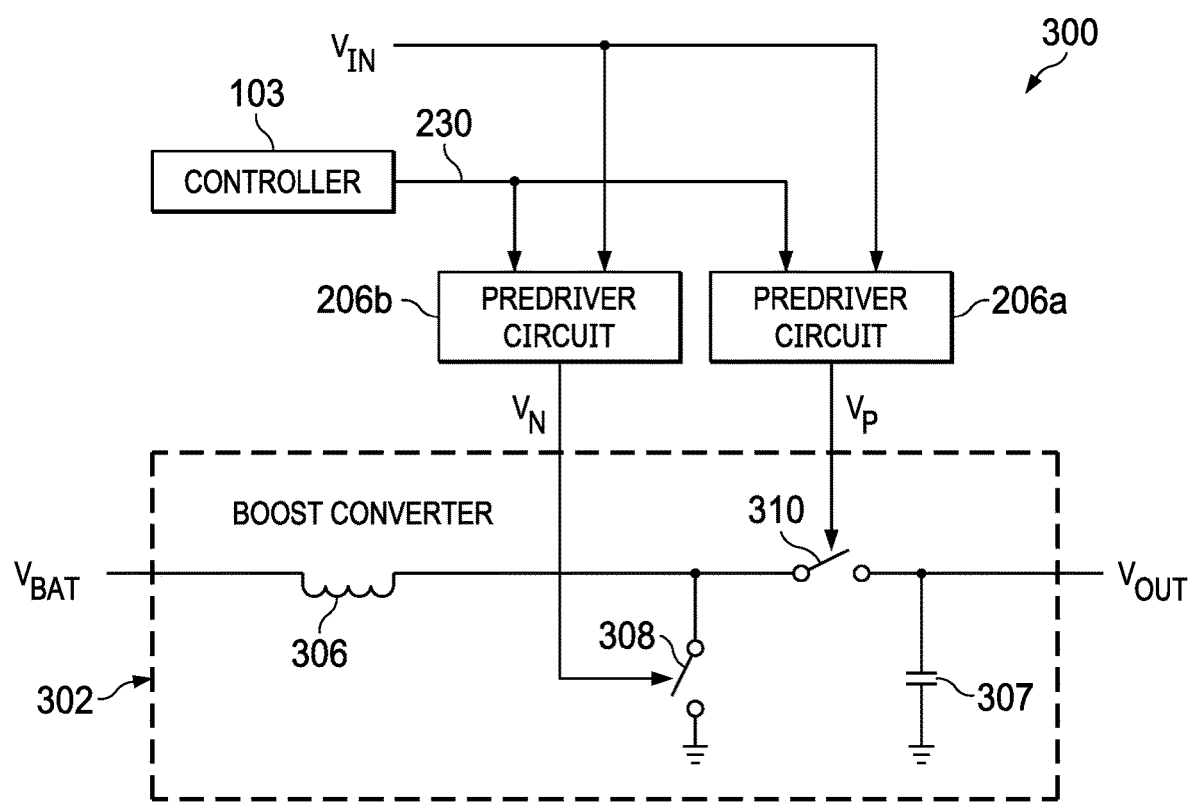
FIG. 3 illustrates an example system comprising a boost converter for converting an input source voltage to produce an output voltage, in accordance with embodiments of the present disclosure.

As shown in FIG. 3, boost converter 302 may comprise an inductor 306 coupled at a first terminal to an input source voltage $V_{BAT}$ and coupled at a second terminal to non-gate terminals of each of switches 308 and 310. Boost converter 302 shown in FIG. 3 may also comprise switch 308 coupled at one non-gate terminal to a ground voltage and coupled at its other non-gate terminal to inductor 306 and a non-gate terminal of switch 310, and switch 310 coupled at one non-gate terminal to inductor 306 and a non-gate terminal of switch 308 and coupled at its other non-gate terminal to a terminal of capacitor 307. Boost converter 302 shown in FIG. 3 may also include a capacitor 307 coupled between a non-gate terminal of switch 310 and a ground voltage.

As shown in FIG. 3, circuit 300 may also include a predriver system comprising predriver circuits 206a and 206b similar or identical to predriver circuits 206a and 206b of FIG. 2, for driving switches 310 and 308 respectively, wherein controller 103 is configured to control a drive strength of predriver circuits 206a and 206b based on one or more measured quantities (e.g., a temperature and/or voltage associated with boost converter 302). In operation, predriver circuits 206a and 206b may be configured to drive a p-side control voltage $V_P$ to the gate terminal of switch 310 and to drive an n-side control voltage $V_P$ to the gate terminal of switch 308. Each of p-side control voltage $V_P$ and n-side control voltage $V_N$ may be complementary pulse-width modulated signals. As a result, output voltage may be a function of the duty cycle of p-side control voltage $V_P$ and input source voltage $V_{BAT}$.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a switched-mode power converter configured to convert an input source voltage to an output voltage;
   a pre-driver for driving a pre-driver signal to the switched-mode power converter, the pre-driver having a variable drive strength; and
   a controller configured to control the variable drive strength based on a temperature associated with the switched-mode power converter to compensate for variation of an output signal edge rate due to variations in the temperature.

2. The system of claim 1, further comprising a temperature sensor formed on an integrated circuit comprising the switched-mode power converter and configured to sense the temperature.

3. The system of claim 1, wherein the at least one measured physical quantity comprises an input source voltage.

4. The system of claim 1, wherein the controller is further configured to:
   determine a relation of the output signal edge rate to the at least one measured physical quantity; and
   generate and communicate one or more control signals to the pre-driver based on the relation in order to control the variable drive strength.

5. The system of claim 1, wherein the switched-mode power converter is configured to drive the output signal as a pulse-width modulated signal.

6. The system of claim 1, wherein the controller is configured to control the variable drive strength in order to maintain the output signal edge rate at an approximate desired edge rate.

7. A method comprising:
   driving an output signal to a switched-mode power converter configured to convert an input source voltage to an output voltage;
   driving a pre-driver signal to the switched-mode power converter with a pre-driver, the pre-driver having a variable drive strength; and
   controlling the variable drive strength based on a temperature associated with the switched-mode power converter to compensate for variation of an output signal edge rate due to variations in the temperature.

8. The method of claim 7, further comprising sensing the temperature with a temperature sensor formed on an integrated circuit comprising the switched-mode power converter.

9. The method of claim 7, wherein the at least one measured physical quantity comprises an input source voltage.

10. The method of claim 7, further comprising:
    determining a relation of the output signal edge rate to the at least one measured physical quantity; and
    generating and communicating one or more control signals to the pre-driver based on the relation in order to control the variable drive strength.

11. The method of claim 7, further comprising driving the output signal as a pulse-width modulated signal.

12. The method of claim 7, further comprising controlling the variable drive strength in order to maintain the output signal edge rate at an approximate desired edge rate.

* * * * *

UNITED STATES PATENT AND TRADEMARK OFFICE
CERTIFICATE OF CORRECTION

PATENT NO. : 10,756,709 B1
APPLICATION NO. : 16/439178
DATED : August 25, 2020
INVENTOR(S) : Wang et al.

Page 1 of 1

It is certified that error appears in the above-identified patent and that said Letters Patent is hereby corrected as shown below:

In the Specification

1. In Column 4, Lines 10-11, delete "mobile device 110." and insert -- mobile device 102. --, therefor.

2. In Column 7, Line 59, delete "output stage 210," and insert -- output stage 201, --, therefor.

Signed and Sealed this
Twentieth Day of September, 2022

Katherine Kelly Vidal
*Director of the United States Patent and Trademark Office*